United States Patent [19]

Bills et al.

[11] Patent Number: 5,510,950
[45] Date of Patent: Apr. 23, 1996

[54] METHOD AND CIRCUIT FOR CONTROLLING AND MONITORING A LOAD

[75] Inventors: Peter J. Bills, Grosse Pointe; Peter Langer, Troy, both of Mich.

[73] Assignee: Ford Motor Company, Dearborn, Mich.

[21] Appl. No.: 318,399

[22] Filed: Oct. 5, 1994

[51] Int. Cl.$^6$ .................................................. H02H 3/14
[52] U.S. Cl. ........................... 361/93; 361/98; 307/116; 371/48
[58] Field of Search .................................. 307/112, 113, 307/114, 115, 116; 361/98, 93, 88, 78, 86, 87; 371/15.1, 16.1, 16.5, 20.1

[56] References Cited

U.S. PATENT DOCUMENTS

| | | | |
|---|---|---|---|
| 4,612,638 | 9/1986 | Kissel | 371/15 |
| 4,701,867 | 10/1987 | Brüggemann | 364/550 |
| 4,740,723 | 4/1988 | Sugayama et al. | 307/633 |
| 4,764,884 | 8/1988 | Noyori | 364/552 |
| 5,075,669 | 12/1991 | Nakadozono et al. | 340/458 |
| 5,119,312 | 6/1992 | Gröger et al. | 364/483 |

*Primary Examiner*—A. D. Pellinen
*Assistant Examiner*—Michael J. Sherry
*Attorney, Agent, or Firm*—Kevin G. Mierzwa; Roger L. May

[57] ABSTRACT

A method and circuit is provided which controls and monitors a load through a single I/O pin of a microprocessor. A predriver circuit including a level shifter responds to a driver control signal from the microprocessor to control energization of a power driver connected in a load circuit. The predriver circuit also includes a monitor stage for detecting fault conditions of the load circuit. The output of the monitor stage is connected with the I/O pin which is configured as either an input or an output pin under microprocessor program control.

4 Claims, 3 Drawing Sheets

METHOD AND CIRCUIT FOR CONTROLLING AND MONITORING A LOAD

TECHNICAL FIELD

This invention relates to a method and circuit for interfacing a controller with a driver for controlling a load and for monitoring the status of the load. More particularly, this invention relates to controlling and monitoring a load through a predriver circuit connected with a single Input/Output (I/O) pin on a microprocessor chip which is configured as either and input or output under program control.

BACKGROUND ART

Circuitry for interfacing a microprocessor with a load for both controlling energization of the load and monitoring the condition of the load is well known in the art. In general such circuitry includes a power transistor for connecting and disconnecting the load with a source of voltage, and further including monitoring circuitry for sensing circuit conditions One of the problems with the prior art approach is that separate I/O pins on the microprocessor chip are employed, one for controlling the load and the other for monitoring the load. See for example U.S. Pat. No. 5,119,312. The approach requires software routines to protect driver in the event of a load short circuit. Furthermore, as the number of loads increases, a point is reached where either a more expensive microprocessor with additional I/O pins is required, or a costly serial peripheral interface (SPI) circuit is used.

SUMMARY OF THE INVENTION

With the foregoing in mind, it is an object of the present invention to provide a method and circuit for both controlling and monitoring the condition of a load from a single controller I/O pin.

In accordance with the present invention a predriver circuit is provided which is connected with a single I/O pin of a microprocessor and responds to a driver control signal from the microprocessor to control a driver connected in a load circuit. The predriver circuit also monitors short and open circuit conditions of the load circuit and provides an input signal to the microprocessor over the same I/O pin. The I/O pin is configured as either an input or an output pin under program control. While configured as an output pin, the microprocessor provides a high logic level control signal. Unless a short circuit exist in the load, the predriver circuit responds to the microprocessor output by latching the driver ON. Thereafter, the I/O pin is configured as an input pin. If a short circuit develops in the load while the driver is latched ON, the predriver circuit unlatches and provides a low logic level input signal to the microprocessor indicative of the short circuit condition. To check for an open circuit in the load, the microprocessor turns the driver OFF by configuring the I/O pin as an output pin and providing a low logic level control signal to the predriver circuit. While the driver is OFF, the microprocessor configures the I/O pin as an input pin. The predriver circuit responds to an open circuit condition in the load by switching the input to the microprocessor from the normal low logic level input to a high logic level input signal at the microprocessor pin.

BRIEF DESCRIPTION OF THE DRAWINGS

Other objects and advantages of the present invention will become apparent from the following detailed description which should be read in conjunction with the drawings in which.

DETAILED DESCRIPTION OF PREFERRED EMBODIMENT

Figure 1:
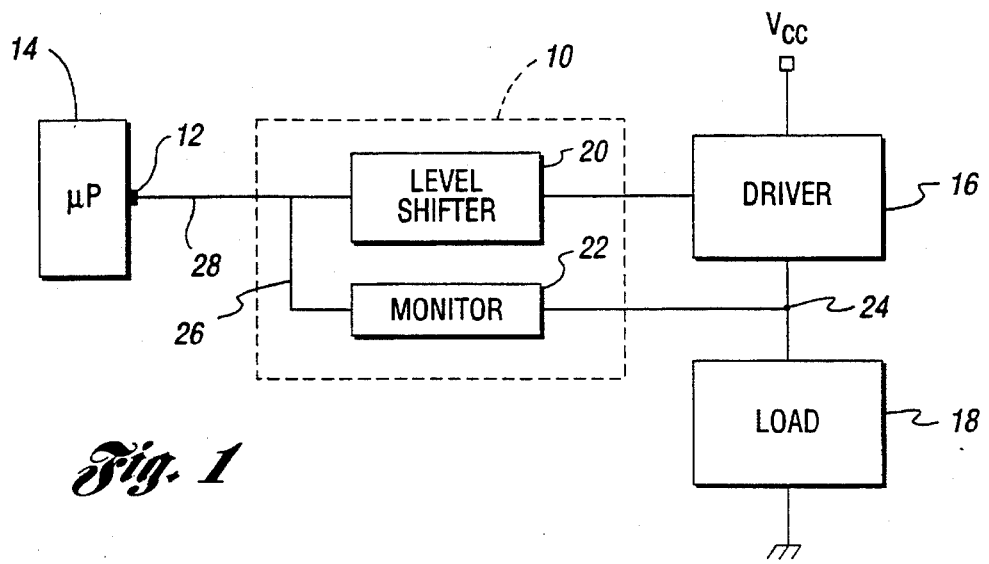
FIG. 1 is a block diagram of the invention.

Referring now to the drawings, and initially to FIG. 1, the predriver circuit of the present invention is generally designated 10 and is connected between an I/O pin 12 of a microprocessor 14 and a driver 16. The driver 16 connects a source of d-c voltage indicated as Vcc, to a load 18. The d-c source may be the battery of a motor vehicle and the load may be a lamp on the vehicle connected between the driver 16 and a reference potential such as ground. The circuit 10 includes a level shifter 20 which translates a 5 volt logic level control signal from the microprocessor 14 to a suitable voltage level for operating the driver 16. The circuit 10 further includes a monitor stage 22 which senses the voltage at a junction 24 and provides a feedback to the level shifter 20 over a conductor 26. The conductor 26 is also connected with I/O pin 12 over conductor 28 to provide an input to microprocessor 14 indicative of the status of the load 18. The predriver 10 and driver 16 form a latch. When the driver is turned ON by the level shifter in response to a control signal from the microprocessor 14 applied to the pin 12, the feedback from the output of monitor stage 22 over conductor 26 maintains the driver latched in the ON state as long as there is no short circuit fault at the load.

While the circuit shows a high side driver 16 i.e. one connected between the source and the loads it will be appreciated by those skilled in the art that the invention is also applicable to a low side driver i.e. one connected between the load and ground.

Figure 2:
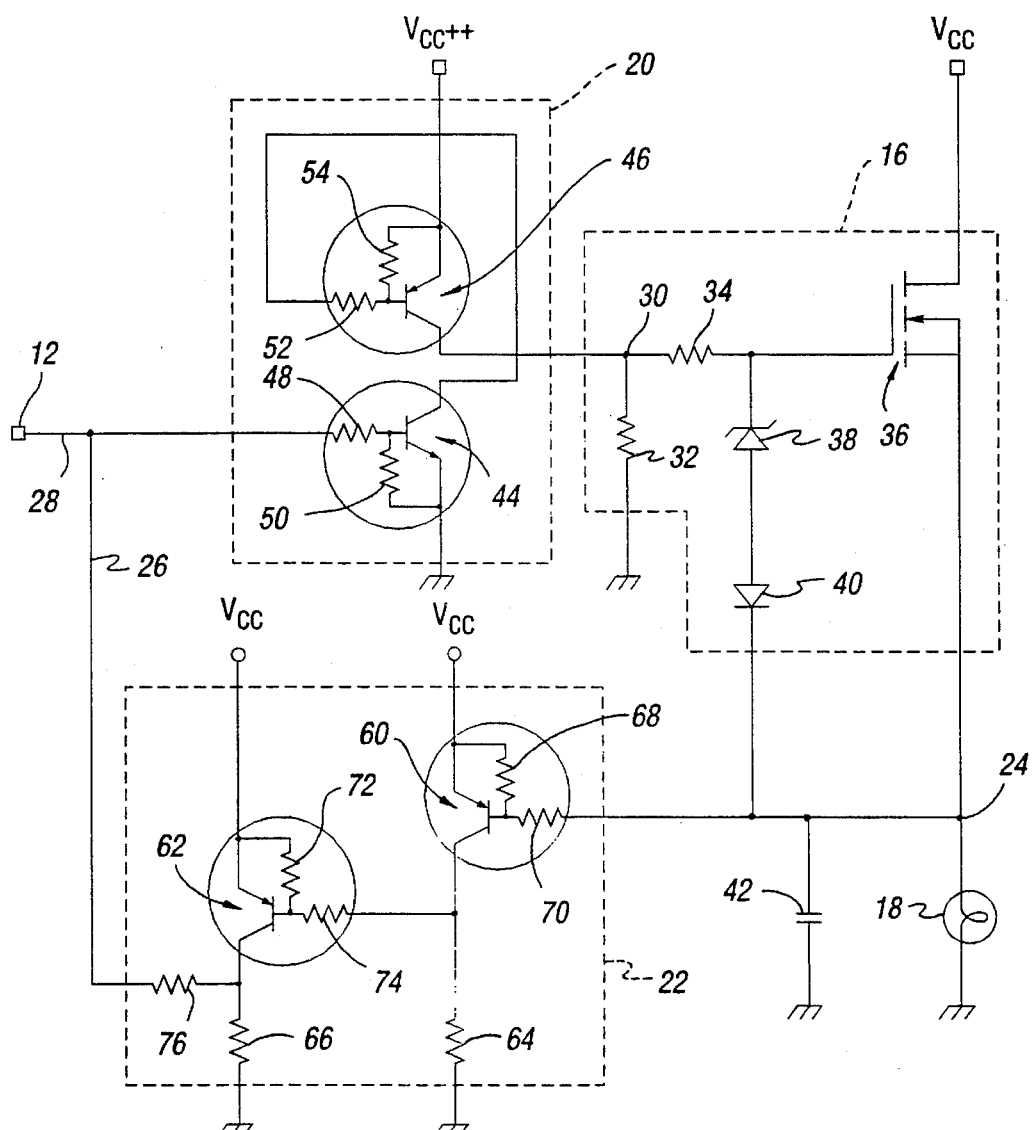
FIG. 2 is a detailed schematic diagram of the predriver circuit of the present invention.

Referring now to FIG. 2, a more detailed schematic of the predriver circuit 10 is shown. The output of the level shifter 20 is connected to a junction 30 between a gate driver resistor 34 and a pull-down resistor 32 connected to ground. Gate resistor 34 is also connected with the gate of an N-channel enhancement type power MOSFET 36. The MOSFET has its source connected with the junction 24 and its drain connected with Vcc. A protection circuit for the MOSFET 36 includes a zener diode 38 and diode 40 serially connected between the source and gate electrodes. A capacitor 42 provides a low impedance to ground for high frequency noise. While a MOSFET device is shown, other power drivers such as a suitable NPN transistor could be employed.

The level shifter 20 includes an NPN transistor 44, a PNP transistor 46 and bias resistors 4854. The base of transistor 44 is connected to the I/O pin 12 through resistor 48 and conductor 28 and to the grounded emitter through resistor 50. The collector of transistor 44 is connected to a boosted supply indicated at Vcc++ through resistors 52 and 54. The base of transistor 46 is connected to the junction between resistors 52 and 54. When transistor 44 is turned ON by the microprocessor 14 the transistor 46 is also turned ON and applies a suitable voltage to the gate of MOSFET 36 to turn the device 36 ON.

The monitor stage 22 includes a pair of PNP transistors 60 and 62. The emitter electrodes of transistors 60 and 62 are connected with a regulated voltage supply indicated at Vcc while the collector electrodes are connected to ground through resistors 64 and 66. The base electrodes are connected to the junction between resistors 68, 70 and 72, 74 respectively. A current limiting resistor 76 is connected in series between the monitor stage 22 and the I/O pin 12. The monitor stage 22 uses the base emitter junction to monitor the drain to source voltage of the MOSFET 36.

The overall operation of the predriver circuit 10 in response to commands from the microprocessor and to load circuit conditions will now be described. To detect a open circuit load condition the microprocessor 14 configures the pin 12 as an input pin and sets the voltage at the pin 12 low. The resistors 50 and 66 insure that the voltage remains low at pin 12 unless an open circuit at the load is detected. If an open circuit occurs i.e. the load 18 is disconnected from ground, the current path through base resistors 68 and 70 is interrupted and transistor 60 will be turned OFF. With transistor 60 OFF, transistor 62 is turned ON raising the voltage at the I/O pin to a logic level high. The check for an open circuit is preferably performed periodically whenever the MOSFET 36 is in an OFF state. An open circuit check may also be performed when switching the MOSFET from the ON state to the OFF state. If an open circuit is detected the check is repeated three times with a 100 msec. delay between checks to confirm the open circuit condition. If an open load is confirmed, the microprocessor 14 should maintain the I/O pin 12 as an output pin with low logic level voltage applied.

To turn the MOSFET 36 ON the microprocessor must configure the pin 12 as an output pin and set the output voltage to a high logic level. With pin 12 high the transistors 44 and 46 are rendered conductive, establishing a turn-on voltage at the gate of the MOSFET 36 which connects the lamp 18 to Vcc. The transistor 60 monitors the drain to source or saturation voltage of MOSFET 36. As long as the voltage drop across the MOSFET is less than the $V_{be}$ of transistor 66 or about 0.7 volts, the transistor 60 will be nonconductive and transistor 62 will be turned ON. When transistor 62 turns ON it provides a current source through resistor 76 to latch the transistor 44 in an ON state. While the predriver circuit 10 is in a latched state the microprocessor reconfigures the pin 12 as an input pin and monitors the voltage at the pin 12. Normally the voltage at the pin 12 is held high due to conduction of the transistor 62. Should a short occur at the load 18, the current increase will cause the voltage drop across MOSFET 36 to increase. When the voltage exceeds 0.7 volt, the transistor 60 turns ON which renders the transistor 62 nonconductive, causing the voltage at the I/O pin 12 and at the base of transistor 44 to go low. Transistors 44 and 46 are thus turned OFF, unlatching the predriver circuit 10, removing voltage from the MOSFET 36, thereby protecting the MOSFET from excessive current. The microprocessor 14 is programmed to respond to the change in voltage at the I/O pin 12 from high to low by turning the MOSFET 36 back ON after a 500 msec. delay. The delay allows the MOSFET 36 to cool down. If the predriver circuit 10 unlatches three times in succession, the microprocessor 14 will assume a short exists and maintain the MOSFET in an OFF state. This fault condition is stored by the microprocessor for subsequent access during vehicle service. The predriver circuit 10 is shown as using discrete components, but it will be understood by those skilled in the art that an application specific integrated circuit (ASIC) could be developed incorporating the function performed by the discrete circuit.

Figure 3A:
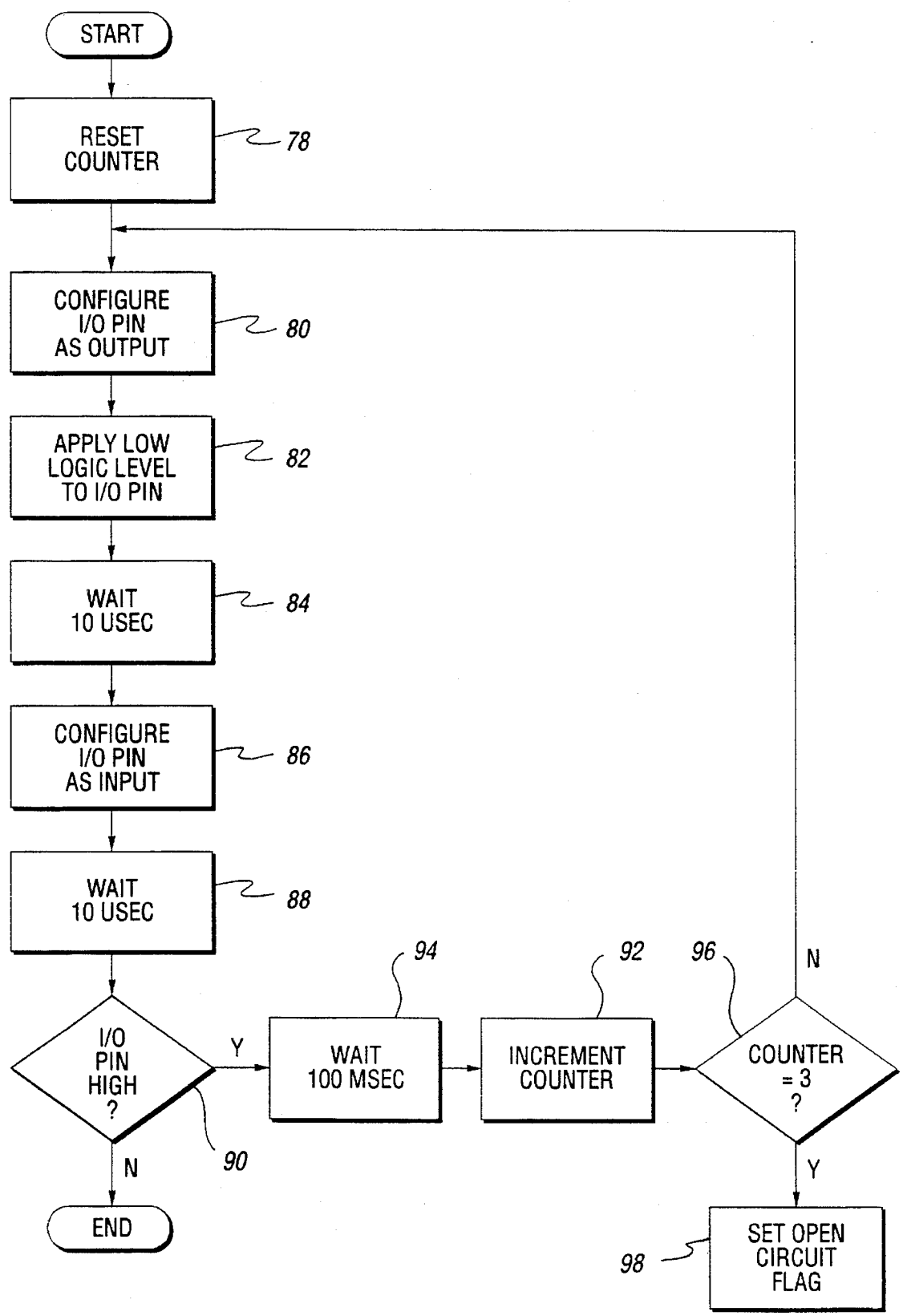
FIGS. 3a and 3b are flow charts of the method used to control the load and monitor for open and short circuit load condition.
Figure 3B:
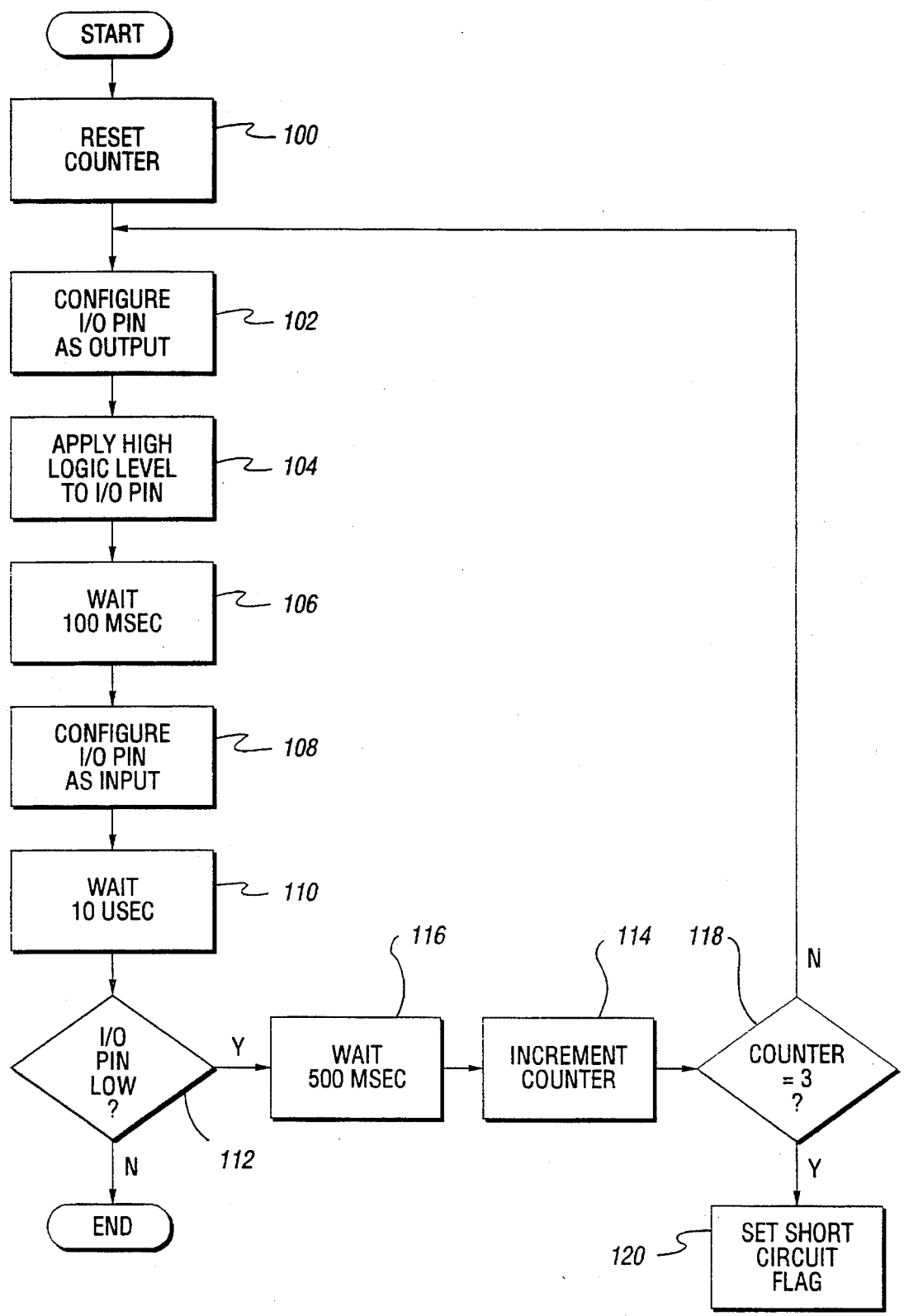

With reference to the flow charts of FIGS. 3a and 3b, the method of controlling and monitoring the load using a single I/O pin of the microprocessor is shown. Referring first to FIG. 3a, the method of detecting an open circuited load is depicted. Preferably, the check for an open load is performed periodically whenever the MOSFET 36 is in the OFF state. Open circuits can also be checked when switching the MOSFET 36 from an ON to an OFF state. A counter is reset as indicated at block 78 and the I/O pin is configured as an output at block 80. After configuring the I/O pin as an output, a low logic level is applied to the I/O pin at block 82. If the MOSFET 36 is ON, this turns the MOSFET OFF and unlatches the predriver 10. If the MOSFET device is already off, applying a low logic level has no effect on the circuit. After a delay of 10 microseconds as indicated at block 84, the I/O pin is configured as an input at block 86 and after another 10 microsecond delay at block 88, the state of the I/O pin is read, to determined whether it is a logic level low or high, as indicated by the decision block 90. If the I/O pin remains low, no further action is required. On the other hand, if the I/O pin switches to a high state, this is indicative of an open circuit in the load 18 and the counter is incremented at 92 after a 100 millisecond delay, indicated at block 94. The sequence of checking for an open circuit at the load is repeated three times, as indicated by the decision block 96 and return of control to the block 80. An open circuit condition is confirmed by three consecutive detections of the high logic level by the decision block 90 in which event an open circuit flag is set at block 98.

The software for turning ON the power driver and detecting a short circuit in the load is depicted in the flowchart of FIG. 3b. The counter is reset at 100 and the I/O pin is configured as an output at 102. A high logic level is applied to the I/O pin at 104 and after a delay of 100 milliseconds, indicated at 106, to permit the lamp 18 to heat up, to I/O pin is configured as an input at 108. After a delay of 10 microseconds at 110, the logic level on the I/O pin is read, to determined whether it is low or high, as indicated by the decision block 112. If the I/O pin remains high, no further action is taken. On the other hand, if the voltage at the I/O pin switches to a low logic level state, the counter is incremented at block 114, after a 500 millisecond delay, indicated by block 116 to permit the MOSFET 38 to cool. If the counter is less than 3, as indicated by the decision block 118, the sequence is repeated by returning control to the block 102. After three consecutive detections of a short circuit condition, the short circuit flag is set at 120.

While the best mode for carrying out the invention has been described in detail, those familiar with the art to which this inventions relates will recognize alternative designs and embodiments for practicing the invention as defined by the following claims:

We claim:

1. A circuit for controlling the application of a source of voltage to a load and for monitoring the condition of said load, said circuit including a driver for connecting said source of voltage to said load, said circuit connected between one pin of a control device and said load, said control device adapted to configure said pin as an input or an output pin, said circuit being responsive to a driver control output signal applied to said pin by said control device while said pin is configured as an output pin for connecting said source of voltage to said load by placing said driver in an ON state, said circuit including monitor circuit means for detecting an open circuited load by monitoring the current flow through said load and for detecting a short circuited load by monitoring the voltage across said driver as a result of current flow through said driver, said monitor circuit means providing a voltage level at said pin for maintaining said driver in an ON state as long as the current flow through said driver is below a predetermined limit and providing a voltage level at said pin for switching said driver to the OFF state when the current flow through said driver exceeds said predetermined limit, said control device storing the occurrence of a short circuited load or an open circuited load responsive to the voltage level supplied at said pin by said monitor circuit means while said pin is configured by said control device as an input pin.

2. The invention defined in claim 1 wherein said circuit includes a level shifter connected between said pin and said driver, said monitor circuit means connected between said pin and a sense point between said driver and said load and including a transistor having an emitter electrode connected with said source of voltage and a base electrode connected with said sense point for sensing the voltage drop across said driver relative to the voltage across the base emitter electrodes of said transistor and providing said input signal to said control device, said input signal providing a first logic level feedback to said pin for turning said driver OFF in response to a short circuit in said load and a second logic level signal to said pin in response to an open circuit in said load.

3. The invention defined in claim 2 wherein said driver comprises a MOSFET device with said load connected in the source and drain path of said MOSFET, said level shifter supplying a gate drive signal to said MOSFET in response to an output signal of a first logic level supplied by said control device at said pin, said monitor circuit means responsive to the source to drain voltage of said MOSFET for maintaining said first logic level signal at said pin as long as said source to drain voltage is below the base to emitter voltage of said transistor in said monitor circuit means.

4. A method of controlling and monitoring the condition of a load circuit from a single input/output pin of a microprocessor, said load circuit including a load and driver means connected with said pin for controlling energization of said load, said method comprising a sequence of the following steps;

configuring said input/output pin as an output pin and applying a first logic level signal to said pin for causing said driver means to connect said load to a source of voltage, detecting the voltage drop across said driver as a function of the current flowing through said driver, applying a first predetermined voltage level to said pin if the voltage drop across said driver exceeds a predetermined threshold level, configuring said input/output pin as an input pin and monitoring the voltage level at said pin, storing a short circuited load fault condition in response to said first predetermined voltage level at said pin, configuring said input/output pin as an output pin and applying a second logic level signal to said pin for causing said driver means to disconnect said load from said source of voltage, applying a second predetermined voltage level to said pin if the current flow through said load drops below a predetermined threshold level, storing an open circuited load fault condition in response to the presence of said second predetermined voltage level at said input/output pin while said pin is configured as an input pin.

* * * * *